(12) United States Patent
Matsuda et al.

(10) Patent No.: US 6,749,072 B2
(45) Date of Patent: *Jun. 15, 2004

(54) FRAME STRUCTURE FOR HOUSING PANEL PLATES

(75) Inventors: Tamotsu Matsuda, Yokohama (JP); Hitoshi Takano, Sagamihara (JP)

(73) Assignee: NIX, Inc., Yokohama (JP)

( * ) Notice: Subject to any disclaimer, the term of this patent is extended or adjusted under 35 U.S.C. 154(b) by 51 days.

This patent is subject to a terminal disclaimer.

(21) Appl. No.: 10/166,388

(22) Filed: Jun. 11, 2002

(65) Prior Publication Data

US 2002/0184831 A1 Dec. 12, 2002

(30) Foreign Application Priority Data

Jun. 12, 2001 (JP) ........................................ 2001-176415

(51) Int. Cl.⁷ .............................................. A47G 19/08
(52) U.S. Cl. ..................... 211/41.17; 211/175; 361/758; 361/752
(58) Field of Search ................................ 211/41.7, 175, 211/26; 361/756, 758, 752; 52/648.1, 649.8, 654.1, 655.1

(56) References Cited

U.S. PATENT DOCUMENTS

| | | | | |
|---|---|---|---|---|
| 4,099,623 A | * | 7/1978 | Van Osdol ................ | 211/41.17 |
| 4,385,781 A | * | 5/1983 | Welsch et al. ............. | 294/161 |
| 4,563,722 A | * | 1/1986 | Maroney et al. ........... | 361/212 |
| 4,600,231 A | * | 7/1986 | Sickles ..................... | 294/161 |
| 4,761,044 A | * | 8/1988 | Akama et al. ............. | 312/110 |
| 5,168,431 A | * | 12/1992 | Moulton et al. ............ | 361/797 |
| 5,593,046 A | * | 1/1997 | Katsuura et al. .......... | 211/41.15 |
| 6,328,169 B1 | * | 12/2001 | Matsuda et al. .......... | 211/41.17 |
| 6,516,955 B1 | * | 2/2003 | Dudhwala et al. ......... | 211/26 |

* cited by examiner

Primary Examiner—Carl D. Friedman
Assistant Examiner—Chi Q Nguyen
(74) Attorney, Agent, or Firm—Oblon, Spivak, McClelland, Maier & Neustadt, P.C.

(57) ABSTRACT

A frame structure includes a pair of sideboards facing each other, each sideboard having an inner surface provided with a plurality of support grooves for receiving and supporting panel plates, a first joint for fixing one of the pair of sideboards to a base and a second joint for fixing the other of the pair of sideboards to the base and provided with a movement-effecting mechanism. The first and second joints have formed on the facing inner surfaces thereof at substantially the same height steps for contacting side surfaces of the panel plates and supporting the panel plates. At least one of the steps has a surface for contacting at one side surface of one of the panel plates prior to panel plates being received in the plurality of support grooves in order to set a distance between end surfaces of opposed ones of the plurality of support grooves equal to a sum of the width of the panel plates received in and supported by the plurality of support grooves and a predetermined clearance. The at least one surface of the steps projects inward by the predetermined clearance from the end surfaces of the support grooves of one of the pair of sideboards.

9 Claims, 5 Drawing Sheets

US 6,749,072 B2

FRAME STRUCTURE FOR HOUSING PANEL PLATES

BACKGROUND OF THE INVENTION

1. Field of the Invention

The present invention relates to a frame structure for housing panel plates, such as printed circuit boards used in electrical and electronic devices, as well as panel plates for use in other industrial fields, such as panels used as construction materials. More particularly, the invention relates to a frame structure that is capable of readily accommodating variations in the width dimension of the panel plates to be housed.

2. Description of the Prior Art

A prior art frame structure will now be described with reference to FIG. 4. In the frame structure shown in the drawing, a top plate 91 is spaced from and fixed to a bottom plate 92 by four support columns 93. The frame structure also has an immovable side frame board 94 that is erected on either the right or left side, and a movable side frame board 95 that is erected on the other side and can be moved horizontally toward the immovable side frame board 94. In order to secure the movable side frame board 95 at a desired position, sliding frames 98 are disposed between the top plate 91 and the bottom plate 92. The top and bottom plates are each provided with a pair of slots 96 through which are inserted the fastening ends of fastening members 97, such as hexagon-headed bolts or screws, protruded upwardly and downwardly from the sliding frames 98 on the outer side of the movable side frame board 95, that can fasten the frames 98 by engagement with mating members 99, such as nuts or the like. The inner faces of the side frame boards 94 and 95 are provided with a plurality of horizontally extending lateral support grooves 100. Each of a plurality of panel plates 101 can be individually supported horizontally between the side frame boards 94 and 95 by the lateral grooves 100.

The distance between the two side frame boards is adjusted in accordance with the width of the panel plates to be housed. If the distance between the boards is the same as the width of the housed panel plates, however, it becomes difficult to smoothly insert or remove the plates. It is therefore necessary to house the plates with a slight clearance. However, setting this clearance requires fine adjustment of the distance between the side frame boards 94 and 95, which is time-consuming. Moreover, it is not easy to always set the same clearance.

In view of the above, the inventors previously proposed the frame structure shown in FIG. 5 and FIG. 6, which enables the distance between two side frame boards to be adjusted with ease (U.S. Pat. No. 6,328,169).

FIG. 5 is a front view of the frame structure. The frame structure 1 comprises a pair of opposed side frame boards 2 and 3, a pair of bases 4 affixed to the upper ends and lower ends of the pair of side boards 2 and 3, and a pair of connecting plates 5 and 6 that connect the facing sides of the pair of bases 4, thus forming a box-like structure with openings at opposite ends through which panel plates 11 can be housed.

Each of the pair of opposed side frame boards 2 and 3 has a plurality of support grooves 8 formed on its inner surface to receive the panel plates 11. The distance between the facing support grooves 8 can be adjusted using the pair of connecting plates 5 and 6 and anchor means 7, such as screws, for anchoring the pair of connecting plates 5 and 6.

To prevent the panel plate 11 thus housed from falling out of the frame structure, a stop member 9 is provided in the vicinity of the opening at each end thereof. Each of the stop members 9 is supported on the upper and lower bases 4 by means of a hinge member 10.

FIG. 6 is an enlarged view of the lower part of the frame structure 1 of FIG. 5 and illustrates how the spacing between the pair of side frame boards 2 and 3 is set according to the panel plates 11 to be housed. To facilitate understanding, the stop members 9 are not shown. In the drawing, reference symbol E denotes the width of a housed panel plate 11, and symbol D denotes the width to be set, which is greater than width E by a predetermined clearance suitable for readily inserting and removing panel plates.

In order to set the distance between the facing support grooves 8 of the pair of side frame boards 2 and 3 to D, the side frame boards are each provided with a spacing adjustment projection 12 to form the predetermined clearance between the inner surfaces of the side frame boards that face each other. A panel plate 11 to be housed is brought into contact with these projections 12, one of the side frame boards 3 is moved toward the other side frame board 2 made immovable to thereby come into pressure contact with the panel plate 11, and the pair of connecting plates 5 and 6 are anchored with the anchor means 7, such as screws. Employing this operation makes it possible to readily set the spacing between the support grooves 8 of the side frame boards 2 and 3 exactly to the width D with high efficiency.

In the previously proposed frame structure, however, the projections have to be removed after setting of the clearance in order to increase the number of panel plates 11 to be housed.

An object of the present invention is therefore to provide a frame structure that can effectively house panel plates without requiring provision and removal of such projections and can set a distance between sideboards that includes a predetermined clearance with high speed and high precision.

SUMMARY OF THE INVENTION

To attain this object, the present invention provides a frame structure that comprises a pair of sideboards facing each other, each sideboard having an inner surface provided with a plurality of support grooves for receiving and supporting panel plates; a first joint for fixing one of the pair of sideboards to a base; and a second joint for fixing the other of the pair of sideboards to the base and provided with a mechanism for effecting movement of the other sideboard toward the one sideboard, the first and second joints having formed on facing inner surfaces thereof at substantially the same height steps for contacting side surfaces of the panel plates and supporting the panel plates, at least one of the steps having a surface for contacting one side surface of one of the panel plates prior to panel plates being received in the plurality of support grooves in order to set a distance between end surfaces of opposed ones of the plurality of support grooves equal to a sum of a width of the panel plates received in and supported by the plurality of support grooves and a predetermined clearance, the at least one surface of the steps projecting inward by the predetermined clearance from the end surfaces of the support grooves of one of the pair of sideboards.

There may be one surface projecting inward by the predetermined clearance from the end surfaces of support grooves of one of the pair of sideboards.

The present invention further provides a frame structure that comprises a pair of sideboards facing each other, each sideboard having an inner surface provided with a plurality of support grooves for receiving and supporting panel plates; first means for fixing one of the pair of sideboards to a base; second means for fixing the other of the pair of sideboards to the base and provided with a mechanism for effecting movement of the other sideboard toward the one sideboard; and an upright wall formed integrally with the base and in front of the one sideboard fixed to the base; the upright wall and second means having formed on facing inner surfaces thereof at substantially the same height steps for contacting side surfaces of the panel plates and supporting the panel plates, the steps having at least one surface for contacting at least one side surface of one of the panel plates prior to the panel plates being received in the plurality of support grooves in order to set a distance between end surfaces of opposed ones of the plurality of support grooves equal to a sum of a width of each of the panel plates received in and supported by the plurality of support grooves and a predetermined clearance, the at least one surface of the steps projecting inward by the predetermined clearance from the end surfaces of the support grooves of one of the pair of sideboards.

Thus, on the first and second joints or on the upright wall and second fixing means, there are formed steps having at least one surface for contacting at least one side surface of one of the panel plates and projecting inward by a predetermined clearance from the end surfaces of the support grooves of one of the pair of sideboards. This eliminates the prior art requirements of providing a projection in a support groove and removing the projection from the support groove. When a panel plate to be housed is placed between the steps and one of the pair of sideboards is moved toward the other sideboard, the distance between the opposed ones of the support grooves becomes the same as the sum of the width of the panel plate and the predetermined clearance.

Further features of the invention, its nature and various advantages will be more apparent from the accompanying drawings and following detailed description of the invention.

DESCRIPTION OF THE PREFERRED EMBODIMENTS

Figure 1:
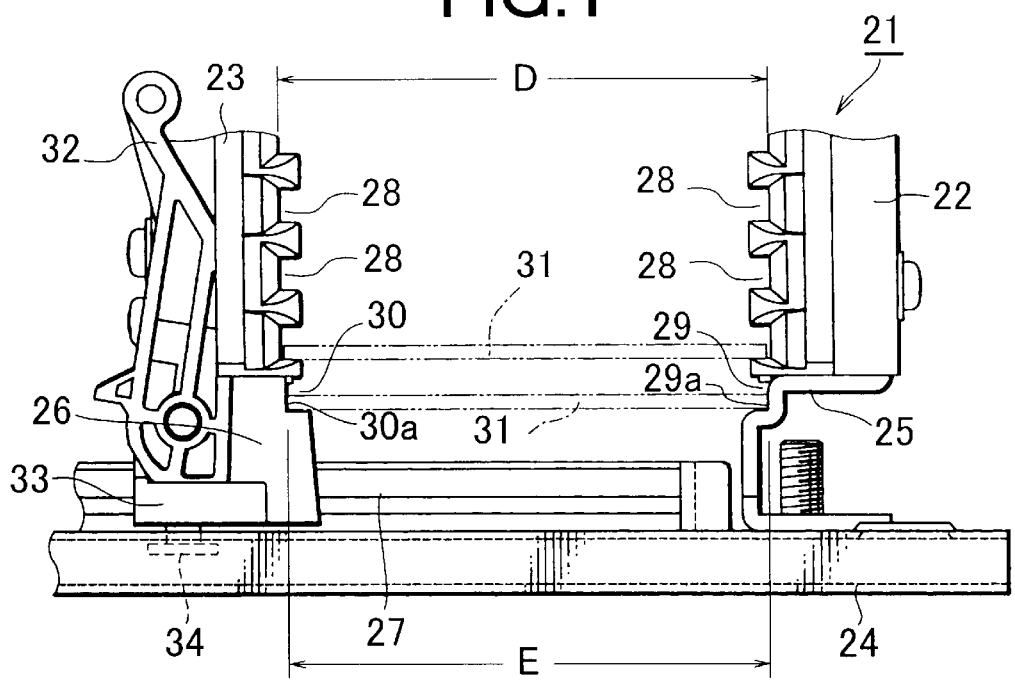
FIG. 1 is a schematic view illustrating the essential part of a frame structure according to a first embodiment of the present invention.

FIG. 1 is a schematic view illustrating the essential (lower) part of a frame structure 21 for housing panel plates, according to a first embodiment of the present invention. In the drawing, sideboards 22 and 23 that face each other have their respective inner surfaces provided with a plurality of support grooves 28 for supporting panel plates 31. One of the sideboards 22 is supported on a joint 25 that is fixed to a base 24 with a screw or other such fastening means. The other sideboard 23 is supported on a joint 26 that can effect parallel movement on a rack 27 fixed onto the base 24 because a toothed wheel (not shown) provided inside the joint 26 is engaged with the rack 27. The joints 25 and 26 have their respective facing inner surfaces provided with steps 29 and 30 that are positioned at substantially the same height for placing a panel plate 31 thereon.

Reference numeral 32 in FIG. 1 denotes a lock lever for fixing the joint 26 to the base 24 in a locked state. A slider 33 is connected to the joint 26. A fastening lug formed on the surface of the slider 33 in contact with the base 24 is formed with a mounting hole at a position corresponding to the position of a slot (not shown) bored in the base 24. The lock lever 32 has a cam surface at its portion in contact with the mounting lug. A tension rod has at its tip end a bulged portion 34 positioned on the rear side of the slot of the base 24, pierces through the slot of the base and the mounting hole of the fastening lug and is connected by means of a pin to the lower portion of the lock lever 32.

With this configuration, when the lock lever 32 is vertically pushed down, the tension rod is pulled upward by means of the cam surface to bring the fastening lug and the bulged portion 34 into pressure contact across the slot, thereby fixing the sideboard 23 to the base 24. When the lock lever 32 is pushed down laterally, a gap is formed between the fastening lug and the bulged portion 34 to permit the sideboard 23 to move.

The structural features of the frame other than those described above, inclusive of the details of the lock lever, will not be described because they are substantially the same as those of the previously proposed frame structure described in detail in U.S. Pat. No. 6,328,169.

Reference symbol D in FIG. 1 denotes a distance to be set, which is equal to the sum of the width E of a panel plate 31 to be housed and a predetermined clearance. In order to set the distance between the end surfaces of the opposed support grooves of the pair of sideboards 22 and 23 equal to D added with the predetermined clearance, when a panel plate 31 is placed on the steps 29 and 30 formed respectively on the sideboards 22 and 23, surfaces 29a and 30a of the steps 29 and 30 in contact with the side surfaces of the panel plate 31 are at locations projecting inward by half the clearance from the end surfaces of the support grooves 28 in contact with the panel plate side surfaces.

By pushing the lock lever 32 downward to permit the sideboard 23 to move, moving the sideboard 23 toward the sideboard 22 and, when the side surfaces of the panel plate 31 come into pressure contact with the contact surfaces 29a and 30a of the steps 29 and 30, pushing the lock lever 32 upward, the joint 26 is fixed to the base 24. As a result, the distance between the end surfaces of the opposed support grooves 28 becomes D, that is, the sum of the width E of the panel plate 31 and the predetermined clearance.

Figure 2:
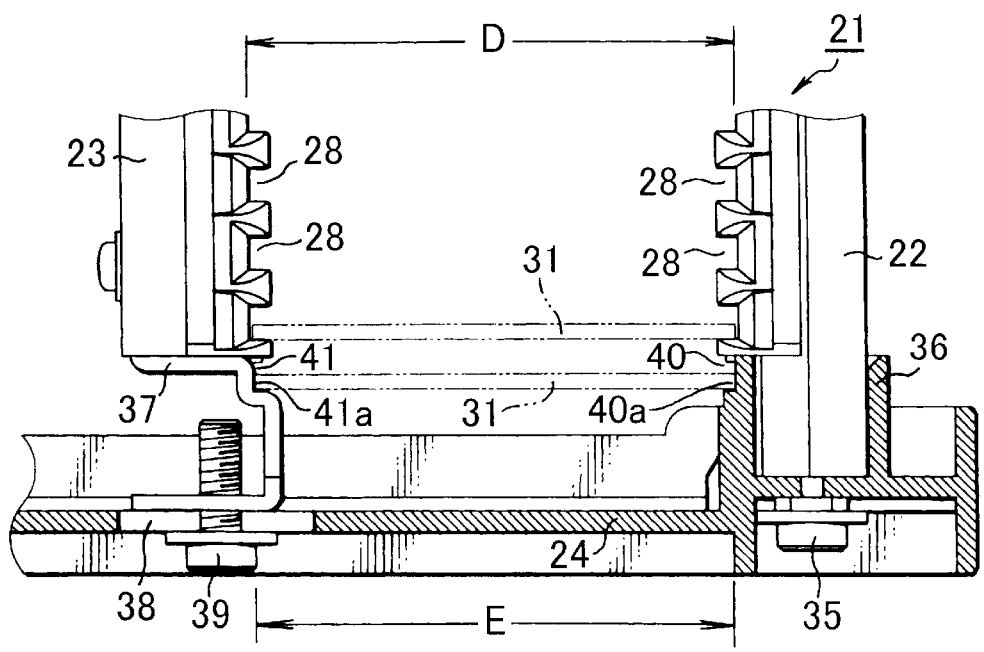
FIG. 2 is a schematic view illustrating the essential part of a frame structure according to a second embodiment of the present invention.

FIG. 2 is a schematic view illustrating the essential (lower) part of a frame structure 21 according to a second embodiment of the present invention. In the frame structure 21 of this embodiment, a base 24 is provided at one end thereof with an integral cylinder 36 serving as a joint, in which the lower portion of one of sideboards 22 (a hat-shaped member) having a plurality of support grooves 28 is fitted. The sideboard 22 is inserted at its lower portion into the cylinder 36 and fixed to the base 24 by means of a screw 35. The other sideboard 23 is supported on a joint 37. A bolt, a long screw or other such rotary fastening member 39 is inserted from below into a slot 38 bored in the base 24 and helically engaged with a mounting hole formed in the bottom of the joint 37. The joint 37 can move along the slot 38 when the rotary fastening member 39 is loosened, but is fixed to the base 24 when the rotary fastening member 39 is fastened.

The cylinder 36 and the joint 37 have steps 40 and 41 formed on their respective facing surfaces at the same height. The steps 40 and 41 have their respective surfaces 40a and 41a in contact with the side surfaces of the panel plate 31, which are at locations projecting inward by half the clearance from the end surfaces of the support grooves 28 in contact with the panel plate side surfaces in the same manner as in the first embodiment.

Since the total amount of projection of the contact surfaces 40a and 41a of the steps 40 and 41 equals the predetermined clearance D, by placing between the steps 40 and 41 a panel plate 31 to be housed, moving the joint 37 toward the cylinder 36 to bring the side surfaces of the panel plate 31 into pressure contact with the contact surfaces 40a and 41a and fixing the joint 37 to the base 24 by means of rotary fastening member 39, the distance between the end surfaces of the opposed support grooves 8 of the sideboards 22 and 23 becomes D, that is, the sum of the width E of the panel plate and the predetermined clearance.

Figure 3:
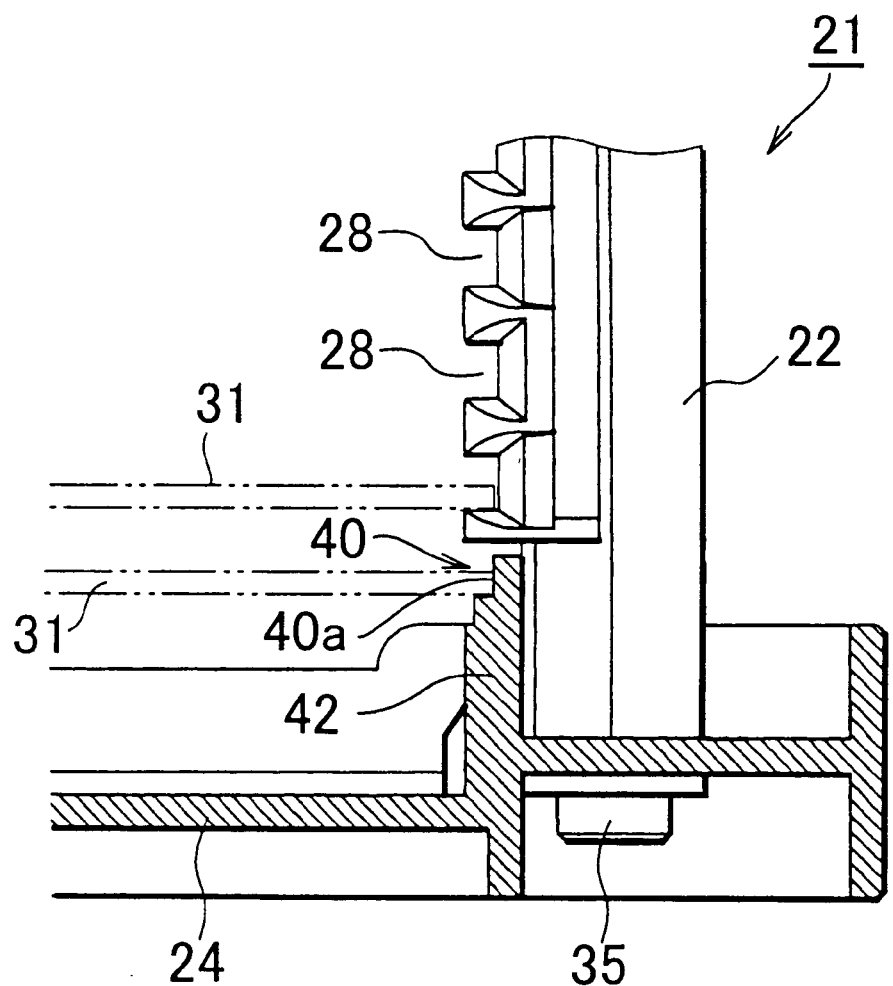
FIG. 3 is a schematic view illustrating the essential part of a frame structure according to a third embodiment of the present invention.
Figure 4:
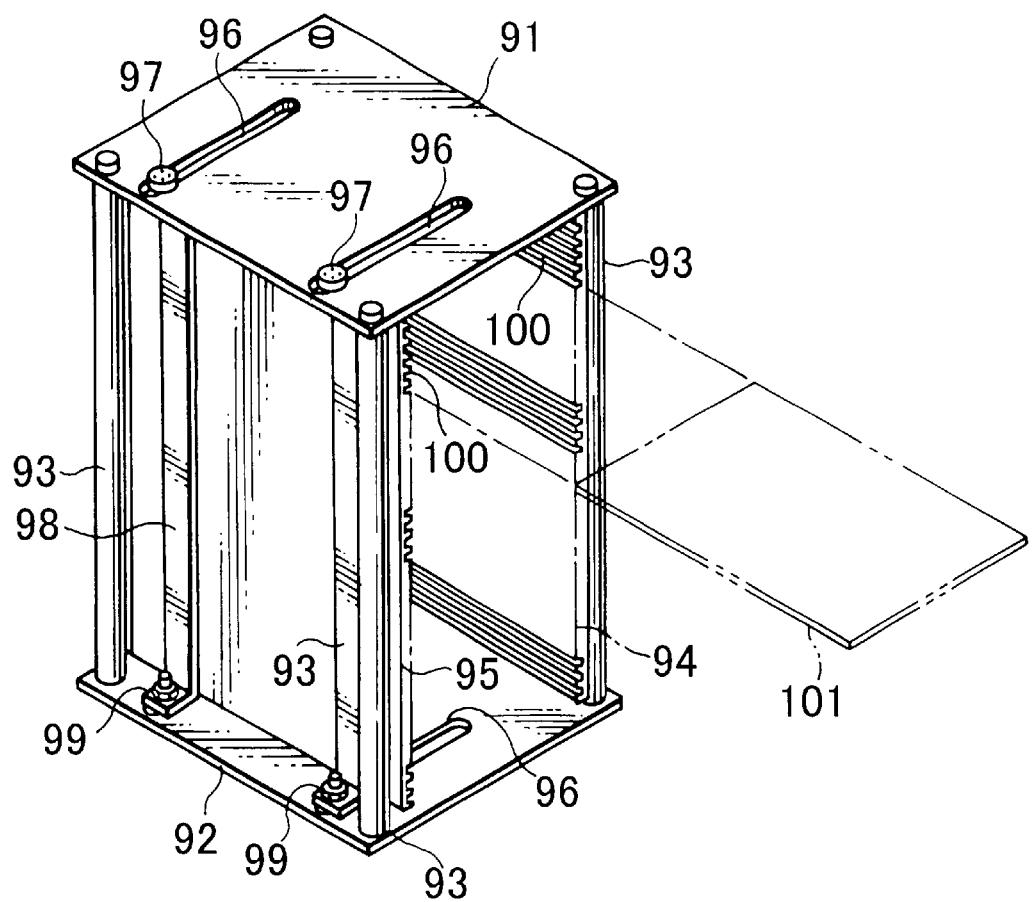
FIG. 4 is a perspective view showing a prior art frame structure.
Figure 5:
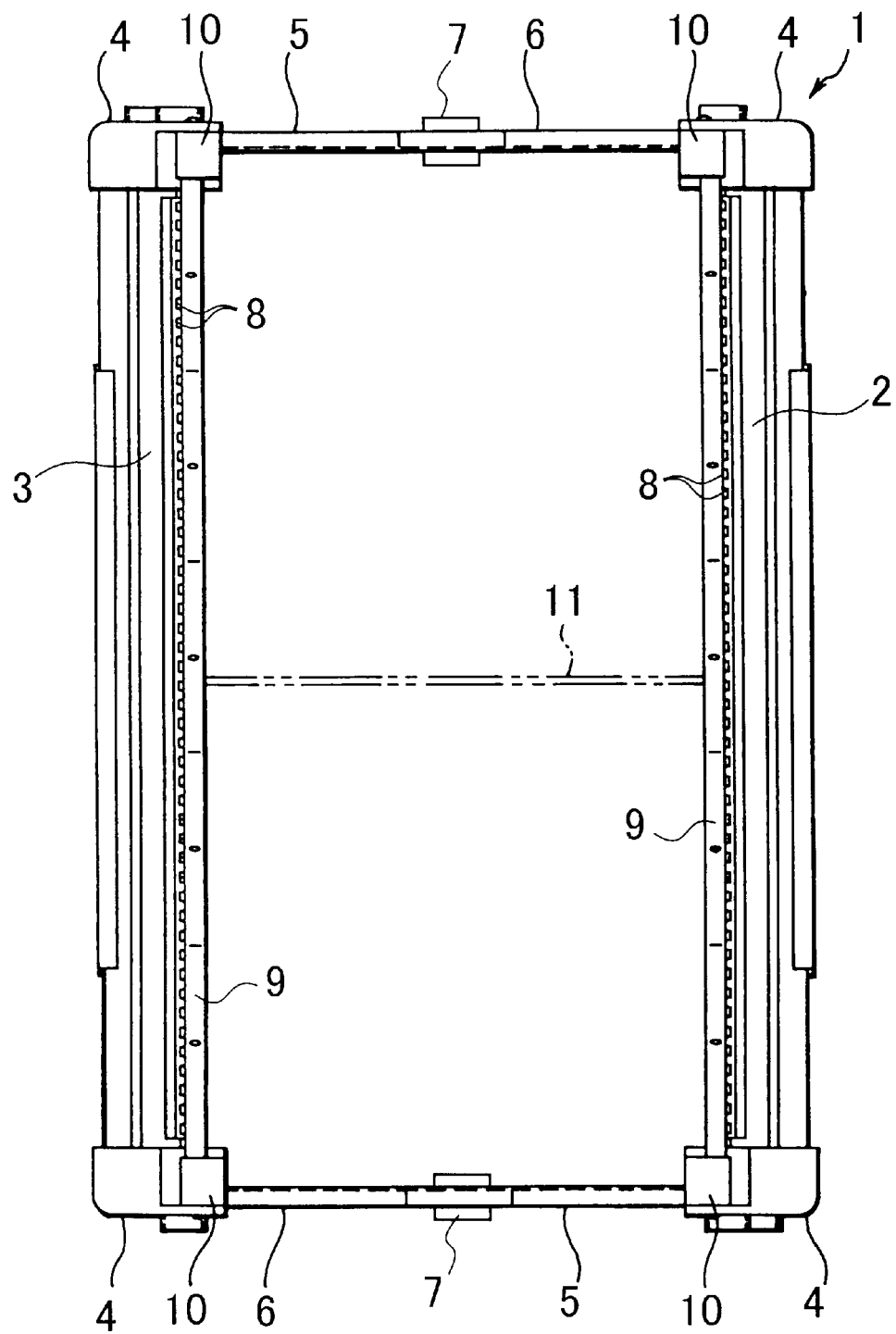
FIG. 5 is a front view of the frame structure the inventors previously proposed.
Figure 6:
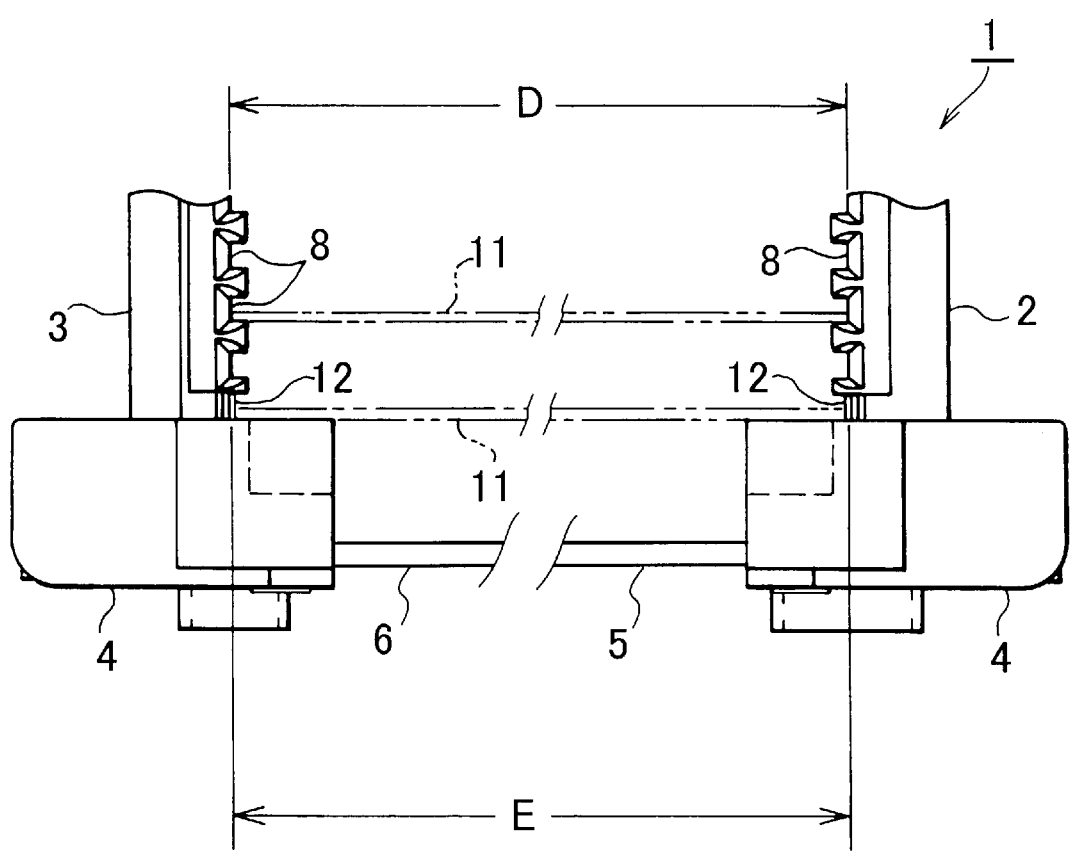
FIG. 6 is an enlarged view of the essential part of the frame structure of FIG. 5.

In the second embodiment, one of the sideboards 22 is fitted in the cylinder 36 integrally formed with the base 24 and is fixed to the base 24 with the screw 35. When the screw 35 can sufficiently firmly fix the sideboard 22 to the base 24, however, an upright wall 42 can be substituted for the cylinder 36 as shown in FIG. 3 illustrating the essential part of a frame structure 21 according to a third embodiment of the present invention. The upright wall 42 is made integral with the base 24, located at a position in front of the lower portion of the sideboard 22, and provided at its upper portion with a step 40 having a contact surface 40a projecting inward by half the predetermined clearance. The position of the contact surface 40a can be determined by adjusting the position of the upright wall 42.

The member on which the step having the contact surface is formed is not limited to a joint, and can be the independent upright wall as described above.

While, in all the embodiments, the contact surfaces coming into contact with the side surfaces of a panel plate are at locations projecting by half the predetermined clearance from the end surfaces of the support grooves coming into contact with the side surfaces of the panel plate, it is sufficient that the distance between the pair of contact surfaces equals the sum of the width of the panel plate and the predetermined clearance. In other words, the amounts of the projection of the contact surfaces are not required to be equal to each other, and one of the contact surfaces may project by the amount of the predetermined clearance.

While each of the aforementioned embodiments is directed to the case where the joint is fixed to the base, the same effects can be obtained even in the case where a joint is formed with a top plate insofar as the joint is formed with a step having a contact surface projecting inward by the clearance from the end surface of the support groove. In this case, means for preventing a panel plate from falling off is adopted when necessary.

As has been described in the foregoing, the present invention utilizes the conventionally non-used dead space of a joint for forming a step to set the distance between opposed support grooves of a pair of sideboards. By presetting the surfaces of steps coming into contact with a panel plate at locations projecting inward by a total amount equal to a predetermined clearance, the distance between the opposed support grooves can be readily, rapidly and precisely set equal to the sum of the width of the panel plate and the clearance. Therefore, provision of a projection in a support groove and removal of the same from the support groove are not required, thus making it possible to provide a frame structure that can be put to highly practical use.

What is claimed is:

1. A frame structure comprising:

a pair of sideboards facing each other, each sideboard having an inner surface provided with a plurality of support grooves for receiving and supporting panel plates;

a first joint for fixing one of the pair of sideboards to a base; and a second joint for fixing the other of the pair of sideboards to the base and provided with a mechanism for effecting movement of the other sideboard toward the one sideboard;

said first and second joints having formed on facing inner surfaces thereof steps for contacting side surfaces of a panel plate and supporting the panel;

at least one of said steps having a surface for contacting one side surface of one of the panel plates prior to panel plates being received in the plurality of support grooves in order to set a distance between end surfaces of opposed ones of the plurality of support grooves equal to a sum of a width of the panel plates received in and supported by the plurality of support grooves and a predetermined clearance;

said at least one surface of the steps projecting inward by the predetermined clearance from the end surfaces of the support grooves of one of the pair of sideboards.

2. The frame structure according to claim 1, wherein the steps are formed on the facing inner surfaces of the first and second joints at substantially the same height.

3. The frame structure according to claim 1, wherein there is one surface projecting inward by the predetermined clearance from the end surfaces of support grooves of one of the pair of sideboards.

4. The frame structure according to claim 1, wherein the first joint is integral with the base.

5. The frame structure according to claim 1, wherein the movement of the other sideboard toward the one sideboard is parallel movement.

6. A frame structure comprising:

a pair of sideboards facing each other, each sideboard having an inner surface provided with a plurality of support grooves for receiving and supporting panel plates;

first means for fixing one of the pair of sideboards to a base;

second means for fixing the other of the pair of sideboards to the base and provided with a mechanism for effecting movement of the other sideboard toward the one sideboard; and an upright wall formed integrally with the base and in front of the one sideboard fixed to the base;

said upright wall and second means having formed on facing inner surfaces thereof steps for contacting side surfaces of a panel plate and supporting the panel plate;

at least one of said steps having a surface for contacting one side surface of one of the panel plates prior to panel plates being received in the plurality of support grooves in order to set a distance between end surfaces of opposed ones of the plurality of support grooves equal to a sum of a width of the panel plates received in and supported by the plurality of support grooves and a predetermined clearance;

said at least one surface of the steps projecting inward by the predetermined clearance from the end surfaces of the support grooves of one of the pair of sideboards.

7. The frame structure according to claim 6, wherein the steps are formed on the facing inner surfaces of the upright wall and second means at substantially the same height.

8. The frame structure according to claim 6, wherein there is one surface projecting inward by the predetermined clearance from the end surfaces of support grooves of one of the pair of sideboards.

9. The frame structure according to claim 6, wherein the movement of the other sideboard toward the one sideboard is parallel movement.

\* \* \* \* \*